(12) United States Patent
Zundel et al.

(10) Patent No.: US 9,184,284 B2
(45) Date of Patent: Nov. 10, 2015

(54) METHOD FOR OPERATING FIELD-EFFECT TRANSISTOR, FIELD-EFFECT TRANSISTOR AND CIRCUIT CONFIGURATION

(71) Applicant: Infineon Technologies AG, Neubiberg (DE)

(72) Inventors: Markus Zundel, Egmating (DE); Peter Nelle, Munich (DE)

(73) Assignee: Infineon Technologies AG, Neubiberg (DE)

( * ) Notice: Subject to any disclaimer, the term of this patent is extended or adjusted under 35 U.S.C. 154(b) by 495 days.

(21) Appl. No.: 13/731,422

(22) Filed: Dec. 31, 2012

(65) Prior Publication Data
US 2014/0184306 A1 Jul. 3, 2014

(51) Int. Cl.
| H01L 29/66 | (2006.01) |
| H01L 29/78 | (2006.01) |
| H03K 17/14 | (2006.01) |
| H03K 17/16 | (2006.01) |

(52) U.S. Cl.
CPC .......... *H01L 29/7827* (2013.01); *H03K 17/145* (2013.01); *H03K 17/162* (2013.01)

(58) Field of Classification Search
CPC ... H03K 17/161; H01L 29/7827; H01L 29/66
USPC ........... 257/213, 328, E29.262, E21.41, 335, 257/330, 331–333, 341, 355; 438/270, 268; 327/382, 378
See application file for complete search history.

(56) References Cited

U.S. PATENT DOCUMENTS

| 6,858,895 | B2 | 2/2005 | Feldtkeller et al. | |
| 6,885,062 | B2 | 4/2005 | Zundel et al. | |
| 7,923,330 | B2 | 4/2011 | Weber | |
| 2006/0278922 | A1* | 12/2006 | Zundel | 257/331 |
| 2008/0265320 | A1* | 10/2008 | Mauder et al. | 257/341 |
| 2009/0166720 | A1* | 7/2009 | Zundel | 257/328 |
| 2009/0267174 | A1* | 10/2009 | Willmeroth et al. | 257/493 |
| 2010/0140689 | A1* | 6/2010 | Yedinak et al. | 257/330 |
| 2012/0018798 | A1* | 1/2012 | Mauder et al. | 257/328 |
| 2012/0286355 | A1* | 11/2012 | Mauder et al. | 257/330 |

FOREIGN PATENT DOCUMENTS

| DE | 102006043485 B4 | 11/2008 |
| DE | 102006062011 B4 | 12/2008 |
| DE | 112007001454 T5 | 4/2009 |

* cited by examiner

*Primary Examiner* — Lincoln Donovan
*Assistant Examiner* — Thomas Skibinski
(74) *Attorney, Agent, or Firm* — Murphy, Bilak & Homiller, PLLC

(57) ABSTRACT

A method for operating a field-effect transistor having a source terminal, a drain terminal, a gate terminal, a drift region and a dielectric region adjoining the drift region, is provided. The method includes: connecting at least one of the drain terminal and the source terminal to a load; applying a sequence of voltage pulses between the gate terminal and the source terminal to repetitively switch the field-effect transistor such that the field-effect transistor is driven in an avalanche mode between the voltage pulses, during the avalanche mode avalanche multiplication occurring in the drift region close to the dielectric region; and applying at least one relaxation pulse to the field-effect transistor to reduce an accumulation of charges in the dielectric region due to hot charge carriers generated in the avalanche mode. Further, a field-effect transistor and a circuit configuration including the field-effect transistor are provided.

26 Claims, 5 Drawing Sheets

METHOD FOR OPERATING FIELD-EFFECT TRANSISTOR, FIELD-EFFECT TRANSISTOR AND CIRCUIT CONFIGURATION

TECHNICAL FIELD

Embodiments of the present invention relate to field-effect transistors, in particular to power field-effect transistors, a circuit configuration and to related methods for operating a field-effect transistor.

BACKGROUND

Semiconductor transistors, in particular field-effect controlled switching devices such as a Junction Field-effect Transistor (JFET), a Metal Oxide Semiconductor Field-effect Transistor (MOSFET) and an Insulated Gate Bipolar Transistor (IGBT) have been used for various applications including but not limited to use as switches in power supplies and power converters, electric cars, air-conditioners, and even stereo systems.

Improvement of reliability and robustness of semiconductor devices is an ongoing aim in the development of semiconductor device and particularly power semiconductor devices. Hot charge carriers generated during an avalanche breakdown may result in shifting of device parameters. Repetitive avalanche breakdowns may even result in premature device failure. Therefore, the properties of the semiconductor device during an avalanche breakdown influence the reliability and are subject for further developments. Furthermore, repetitive avalanche breakdowns frequently occur in demanding applications such as driving an inductive load and can render a device useless.

Accordingly, there is a need to improve field-effect semiconductor transistors and operating field-effect semiconductor transistors, respectively.

SUMMARY

According to an embodiment of a method for operating a field-effect transistor having a source terminal, a drain terminal, a gate terminal, a drift region and a dielectric region adjoining the drift region, the method includes: connecting at least one of the drain terminal and the source terminal to a load; applying a sequence of voltage pulses between the gate terminal and the source terminal to repetitively switch the field-effect transistor such that the field-effect transistor is driven in an avalanche mode between the voltage pulses, during the avalanche mode avalanche multiplication occurring in the drift region close to the dielectric region; and applying at least one relaxation pulse to the field-effect transistor to reduce an accumulation of charges in the dielectric region due to hot charge carriers generated in the avalanche mode.

According to an embodiment of a circuit configuration, the circuit configuration includes a field-effect transistor and a driver configuration. The field-effect transistor includes: a semiconductor body including a source region of a first conductivity type, a body region of a second conductivity type adjoining the source region, and a drift region of the first conductivity type adjoining the body region; a gate electrode which is insulated from the semiconductor body; a field electrode which is insulated from the gate electrode; a dielectric region arranged between the field electrode and the semiconductor body; a gate terminal in ohmic contact with the gate electrode; a field terminal in ohmic contact with the field electrode; and a source terminal in ohmic contact at least with the source region. The driver configuration is connected to the gate terminal, the field terminal, and the source terminal. The driver configuration is configured to generate a first sequence of first voltage pulses between the gate terminal and the source terminal, and a second sequence of second voltage pulses between the field terminal and the source terminal, the second voltage pulses having a shorter pulse width than the first voltage pulses.

According to an embodiment of a circuit configuration, the circuit configuration includes a field-effect transistor and a driver configuration. The field-effect transistor includes: a semiconductor body including a source region of a first conductivity type, a body region of a second conductivity type adjoining the source region, and a drift region of the first conductivity type adjoining the body region; a gate electrode; a field electrode; a dielectric region arranged between the gate electrode and the field electrode, between the gate electrode and the semiconductor body and between the field electrode and the semiconductor body; a gate terminal in ohmic contact with the gate electrode; a first field terminal in ohmic contact with a first portion of the field electrode; a drain terminal in ohmic contact with the drift region; and a source terminal in ohmic contact at least with the source region. The driver configuration is connected to the gate terminal, the first field terminal, the drain terminal and the source terminal. The driver configuration is in a protecting mode configured to: apply a first sequence of first voltage pulses between the gate terminal and the source terminal to switch the field-effect transistor; and a second sequence of second voltage pulses between the first field terminal and the source terminal. The driver configuration is further configured to apply at least one of a third sequence of third voltage pulses between the first field terminal and a second field terminal in ohmic contact with a second portion of the field electrode, and a fourth sequence of fourth voltage pulses between the drain terminal and the source terminal.

According to an embodiment of a field-effect transistor, the field-effect transistor includes: a semiconductor body including a source region of a first conductivity type, a body region of a second conductivity type adjoining the source region, and a drift region of the first conductivity type adjoining the body region; a field electrode including a first portion and second portion; a gate electrode which is insulated from the field electrode; a dielectric region arranged at least between the field electrode and the drift region; a first field terminal in ohmic contact with the first portion; and a second field terminal in ohmic contact with the second portion.

Those skilled in the art will recognize additional features and advantages upon reading the following detailed description, and upon viewing the accompanying drawings.

BRIEF DESCRIPTION OF THE DRAWINGS

The components in the figures are not necessarily to scale, instead emphasis being placed upon illustrating the principles of the invention. Moreover, in the figures, like reference numerals designate corresponding parts. In the drawings.

DETAILED DESCRIPTION

Figure 1:
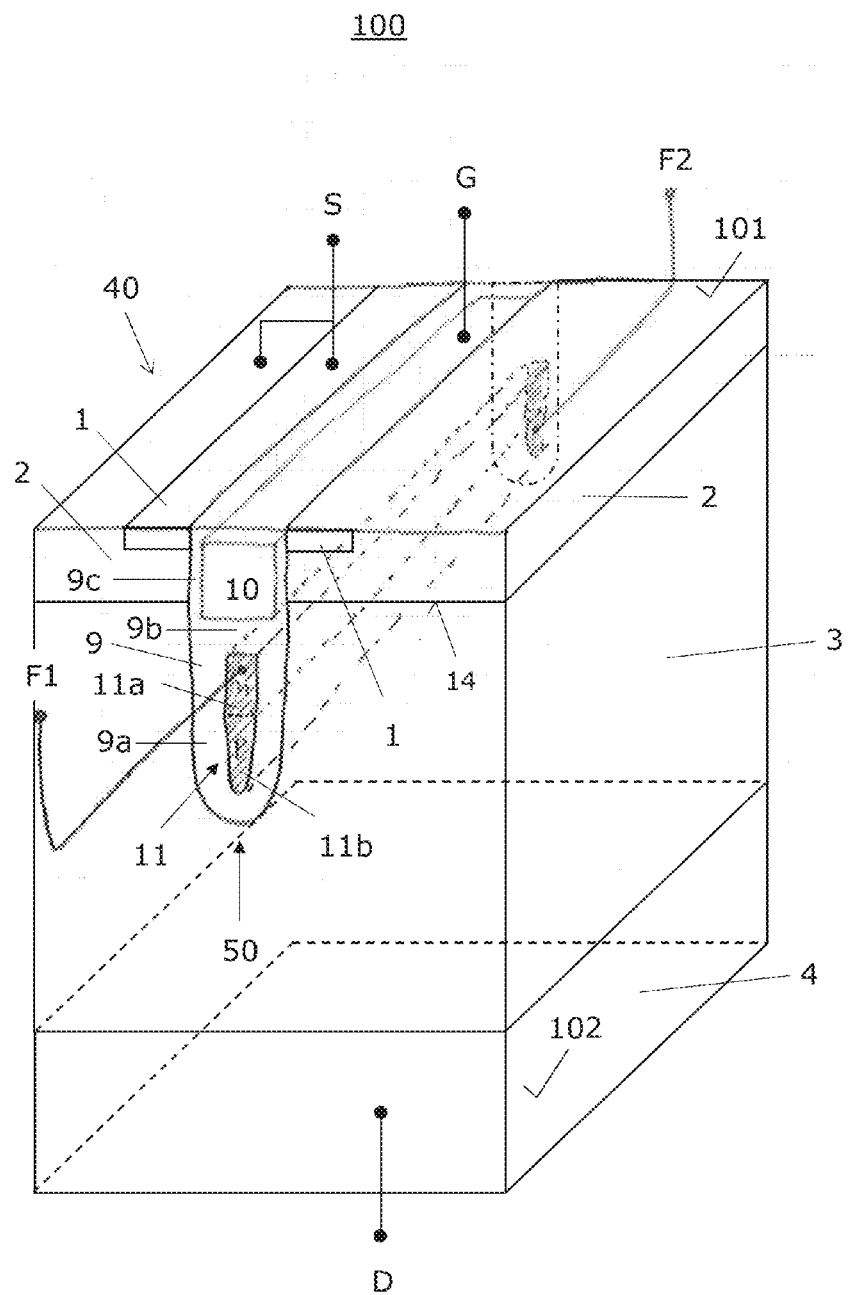
FIG. 1 illustrates in a schematic perspective view a field-effect transistor according to an embodiment.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Reference will now be made in detail to various embodiments, one or more examples of which are illustrated in the figures. Each example is provided by way of explanation, and is not meant as a limitation of the invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appending claims. The drawings are not scaled and are for illustrative purposes only. For clarity, the same elements or manufacturing steps have been designated by the same references in the different drawings if not stated otherwise.

The term "horizontal" as used in this specification intends to describe an orientation substantially parallel to a first or main surface of a semiconductor substrate or body. This can be for instance the surface of a wafer or a die.

The term "vertical" as used in this specification intends to describe an orientation which is substantially arranged perpendicular to the first surface, i.e. parallel to the normal direction of the first surface of the semiconductor substrate or body.

In this specification, a second surface of a semiconductor substrate of semiconductor body is considered to be formed by the lower or backside surface while the first surface is considered to be formed by the upper, front or main surface of the semiconductor substrate. The terms "above" and "below" as used in this specification therefore describe a relative location of a structural feature to another structural feature with consideration of this orientation.

In this specification, n-doped is referred to as first conductivity type while p-doped is referred to as second conductivity type. Alternatively, the semiconductor devices can be formed with opposite doping relations so that the first conductivity type can be p-doped and the second conductivity type can be n-doped. Furthermore, some Figures illustrate relative doping concentrations by indicating "−" or "+" next to the doping type. For example, "n−" means a doping concentration which is less than the doping concentration of an "n"-doping region while an "n+"-doping region has a larger doping concentration than the "n"-doping region. However, indicating the relative doping concentration does not mean that doping regions of the same relative doping concentration have to have the same absolute doping concentration unless otherwise stated. For example, two different n+-doping regions can have different absolute doping concentrations. The same applies, for example, to an n+-doping and a p+-doping region.

Specific embodiments described in this specification pertain to, without being limited thereto, to field-effect semiconductor transistors, in particular to power field-effect semiconductor transistors and operating methods therefor. The field-effect transistor is typically a MOSFET having a pn-junction forming a body diode between a drift region of the first conductivity type and a body region of the second conductivity type. The semiconductor device is typically a vertical semiconductor device having two load metallizations, for example a source metallization and a drain metallization, which are arranged opposite to each other and in low resistive contact with a respective contact region.

The term "commutating" as used in this specification intends to describe the switching of the current of a semiconductor device from a forward direction or conducting direction in which a pn-load junction, for example the pn-junction between the body region and the drift region, is forwardly biased to the opposite direction or reverse direction in which the pn-load junction is reversely biased. Operating the semiconductor device with reversely biased pn-load junction is in the following also referred to as operating the semiconductor device in a blocking mode. Likewise, operating the semiconductor device with forwardly biased pn-load junction is in the following also referred to as operating the semiconductor device in a forward mode. The term "hard commutating" as used in this specification intends to describe commutating with a speed of at least about $10^{10}$ V/s, more typically with a speed of at least about $2*10^{10}$ V/s.

Typically, the semiconductor device is a power semiconductor device having an active area with a plurality MOSFET-cells for carrying and/or controlling a load current between the two load metallizations. Furthermore, the power semiconductor device has typically a peripheral area with at least one edge-termination structure at least partially surrounding the active area when seen from above.

The term "power semiconductor device" as used in this specification intends to describe a semiconductor device on a single chip with high voltage and/or high current switching capabilities. In other words, power semiconductor devices are intended for high current, typically in the Ampere range. Within this specification the terms "power semiconductor device" and "power semiconductor component" are used synonymously.

The term "field-effect" as used in this specification intends to describe the electric-field mediated formation of a conductive "channel" of a first conductivity type and/or control of conductivity and/or shape of the channel between two regions of the first conductivity type. The conductive channel may be formed and/or controlled in a semiconductor region of a second conductivity type, typically a body region of the second conductivity type, which is arranged between the two regions of the first conductivity type. Due to the field-effect, a unipolar current path through the channel region is formed and/or controlled between a source region and a drift region of the first conductivity type in a MOSFET-structure. The drift region may be in contact with a higher doped drain region of the first conductivity type. The drain region is typically in low resistive electric contact with a drain metallization forming a drain terminal. The source region is typically in low resistive electric contact with a source metallization forming a source terminal.

In the context of the present specification, the term "metallization" intends to de-scribe a region or a layer with metallic or near metallic properties with respect to electric conductivity. A metallization may be in contact with a semiconductor region to form an electrode, a pad and/or a terminal of the semiconductor device. The metallization may be made of and/or comprise a metal such as Al, Ti, W, Cu and Co but may also be made of a material with metallic or near metallic properties with respect to electric conductivity such as highly doped n-type or p-type poly-Si, TiN or an electrically conductive silicide such as $TaSi_2$, $TiSi_2$, PtSi, $CoSi_2$, $WSi_2$ or the like. The metallization may also include different electrically conductive materials, for example a stack of those materials.

In the context of the present specification, the terms "in ohmic contact", in resistive electric contact" and "in resistive electric connection" intend to describe that there is an ohmic current path between respective elements or portions of a semiconductor device at least when no voltages or only low probe voltages are applied to and/or across the semiconductor device. Likewise, the terms in low ohmic contact, "in low resistive electric contact" and "in low resistive electric connection" intend to describe that there is a low resistive ohmic current path between respective elements or portions of a semiconductor device at least when no voltages are applied to and/or across the semiconductor device.

In the context of the present specification, the term "MOS" (metal-oxide-semiconductor) should be understood as including the more general term "MIS" (metal-insulator-semiconductor). For example, the term MOSFET (metal-oxide-semiconductor field-effect transistor) should be understood to include FETs having a gate insulator that is not an oxide, i.e. the term MOSFET is used in the more general term meaning of IGFET (insulated-gate field-effect transistor) and MISFET (metal-insulator-semiconductor field-effect transistor), respectively.

In the context of the present specification, the term "gate electrode" intends to describe an electrode which is situated next to, and configured to form and/or control a channel region. The term "gate electrode" shall embrace an electrode which is situated next to, and insulated from the body region by an insulating region forming a gate dielectric region and configured to form and/or control a channel region through the body by charging to an appropriate voltage.

In the context of the present specification, the term "field electrode" intends to describe an electrode which is arranged next to a semiconductor region, typically the drift region, insulated from the semiconductor region and the semiconductor body, respectively, and configured to expand during normal operation a depleted portion in the semiconductor region by charging to an appropriate voltage, typically a negative voltage with regard to the surrounding semiconductor region for an n-type semiconductor region. Typically, the field electrode, respectively, is arranged in the semiconductor body and is insulated from the semiconductor body by an insulating region forming a field dielectric region. During the blocking mode, the field electrode may be charged with counter charges, typically negative charges for an n-type semiconductor region adjoining the insulating region, so that a portion of the semiconductor region is depleted by the counter charges.

The gate electrode and the field electrode may be made of a material with high enough electric conductivity so that the conductive region forms an equipotential region during device operation. For example, the conductive region may be made of a material with metallic or near-metallic electric conductivity such as a metal, for example wolfram, highly doped poly-silicon, a silicide or the like.

In the following, embodiments pertaining to semiconductor devices and manufacturing methods for forming semiconductor devices are explained mainly with reference to silicon (Si) semiconductor devices. Accordingly, a monocrystalline semiconductor region or layer is typically a monocrystalline Si-region or Si-layer. It should, however, be understood that the semiconductor body can be made of any semiconductor material suitable for manufacturing a semiconductor device. Examples of such materials include, without being limited thereto, elementary semiconductor materials such as silicon (Si) or germanium (Ge), group IV compound semiconductor materials such as silicon carbide (SiC) or silicon germanium (SiGe), binary, ternary or quaternary III-V semiconductor materials such as gallium nitride (GaN), gallium arsenide (GaAs), gallium phosphide (GaP), indium phosphide (InP), indium gallium phosphide (InGaPa), aluminum gallium nitride (AlGaN), aluminum indium nitride (AlInN), indium gallium nitride (InGaN), aluminum gallium indium nitride (AlGaInN) or indium gallium arsenide phosphide (InGaAsP), and binary or ternary II-VI semiconductor materials such as cadmium telluride (CdTe) and mercury cadmium telluride (HgCdTe) to name few. The above mentioned semiconductor materials are also referred to as homojunction semiconductor materials. When combining two different semiconductor materials a heterojunction semiconductor material is formed. Examples of heterojunction semiconductor materials include, without being limited thereto, aluminum gallium nitride (AlGaN)-aluminum gallium indium nitride (AlGaInN), indium gallium nitride (InGaN)-aluminum gallium indium nitride (AlGaInN), indium gallium nitride (InGaN)-gallium nitride (GaN), aluminum gallium nitride (AlGaN)-gallium nitride (GaN), indium gallium nitride (InGaN)-aluminum gallium nitride (AlGaN), silicon-silicon carbide ($Si_xC_{1-x}$) and silicon-SiGe heterojunction semiconductor materials. For power semiconductor applications currently mainly Si, SiC, GaAs and GaN materials are used. If the semiconductor body comprises a high band gap material such as SiC or GaN which has a high breakdown voltage and high critical avalanche field strength, respectively, the doping of the respective semiconductor regions can be chosen higher which reduces the on-state resistance Ron in the following also referred to as on-resistance Ron.

With reference to FIG. 1, embodiments of a field-effect transistor 100 are explained. FIG. 1 illustrates a perspective view of a semiconductor body 40 of the semiconductor device 100. The semiconductor body 40 has a main surface 101 with a normal direction defining a vertical direction and a back surface 102 which is arranged opposite to the main surface 101. In the following the main surface 101 is also referred to as main horizontal surface. The semiconductor body 40 includes a source region 1 of a first conductivity type, a body region 2 of a second conductivity type which adjoins the source region 1, and a drift region 3 of the first conductivity type which adjoins the body region 2. The source region 1 and the body region 2 may extend to the man surface 101.

In the exemplary embodiment, a vertical trench 50 extends from the main surface 101 into the semiconductor body 40. A gate electrode 10 and a field electrode 11 are arranged in the vertical trench 50 and separated from each other and the semiconductor body 40 by a dielectric region 9. The field electrode 11 is arranged vertically below the gate electrode 10, the body region 2 and the source region 1.

A lower portion 9a of the dielectric region 9 is arranged between the field electrode 11 and the drift region 3. The lower portion 9a is in the following also referred to as field oxide or field dielectric region. An upper portion 9c of the dielectric region 9 is arranged between the gate electrode 10 and the source region 1, the body region 2 and the drift region 3, and forms a gate oxide or gate dielectric region. Between the gate electrode 10 and the field electrode 11 an inter-electrode dielectric region 9b of the dielectric region 9 is arranged. The field dielectric region 9a, the inter-electrode dielectric region 9b and the gate dielectric region 9c may be made of the same dielectric material, or example SiO$_2$.

A source metallization in low resistive electric connection with the source region 1 and the body region 2 via a higher doped body contact region of the second conductivity type (not shown in FIG. 1) may be arranged on the main surface 101 to form a source terminal S.

Further, a gate metallization in low resistive electric connection with the gate electrode 10 may be arranged on the main surface 101 to form a gate terminal G.

To form a drain terminal D, a drain metallization maybe arranged opposite to the source metallization, i.e. on the back surface 102, and in low resistive electric connection with the drift region 3 via a drain region 4 of the first conductivity type, which has a higher maximum doping concentration than the drift region 3.

In a forward mode, a channel region may be formed in the body region 2 between the source region 1 and the drift region 3 by applying an appropriate voltage difference between the gate terminal G and the source terminal S. Accordingly, the semiconductor device 100 may be operated as a MOSFET.

During a blocking mode, in which a pn-junction 14 formed between the body region 2 and the drift region 3 is reversely biased, the field electrode 11 typically provides counter charges (negative charges in case of an n-type drift region) to increase the blocking voltage of the semiconductor device 100.

Typically, a so-called "field stop region" can be formed underneath the drift region 3 and between the drift region 3 and the drain region 4, respectively, to restrict the spatial extension of the electrical field during the blocking mode. The vertical trench 50 can extend up to and beyond such a field stop region.

According to an embodiment, the field electrode 11 has a first portion 11a and second portion 11b. A first field terminal F1 is in low ohmic contact with the first portion 11a and a second field terminal F2 is in low ohmic contact with the second portion 11b. The first field terminal F1 and the second field terminal F2 may also be arranged of the main surface 101.

In the exemplary embodiment illustrated in FIG. 1, the first portion 11a and the second portion 11b are arranged below each other and of opposite conductivity type so that a pn-junction 14 is formed between the first portion 11a and the second portion 11b of the field electrode 11. For example, the first portion 11a may be formed by highly doped n-type poly-Si (poly-silicon) and the second portion 11b may be formed by highly doped p-type poly-Si.

Figure 5:
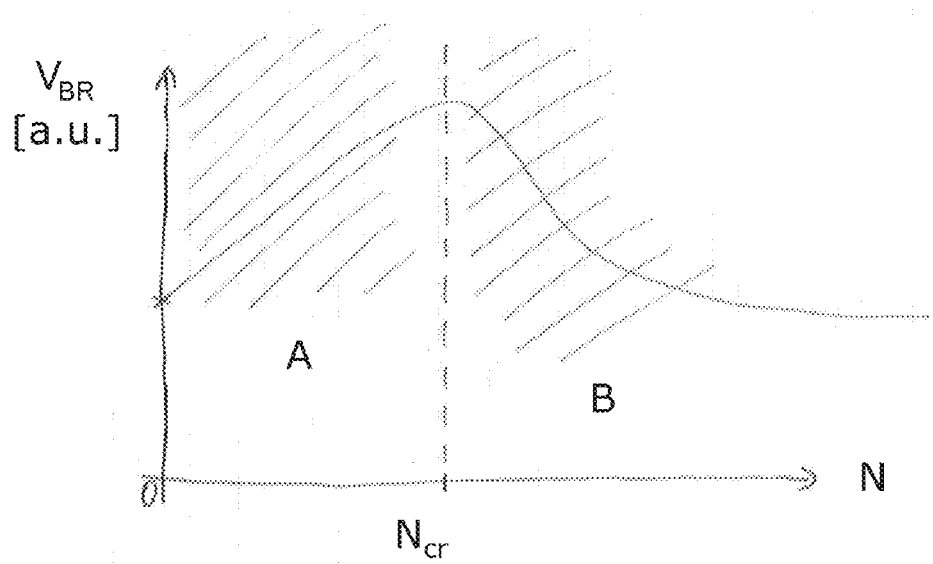
FIG. 5 illustrates a drift of the break-down voltage of a MOSET due to repetitive avalanche.

During normal operation, the first field terminal F1 and the second field terminal F2 are typically connected with the source terminal S. When the vertical MOSFET 100 is used to drive an inductive load, avalanche break-down may occur during the blocking mode. An avalanche breakdown is tolerable if it does not affect structural or functional elements of the semiconductor device 100. However, hot charge carries generated during avalanche break-down may hit dielectric region 9. Repetitive avalanche may result in charging of the dielectric region 9 and a drift of the device characteristics such as break-down voltage, capacitances and cutoff-voltage. This is schematically illustrated in FIG. 5 showing the averaged break-down voltage $V_{BR}$ of power-MOSFET as function of number N of avalanche breakdown events. Until a critical number $N_{cr}$ of avalanche events is reached, the averaged break-down voltage $V_{BR}$ typically increases. This corresponds to a stable region A in which no current filamentation between the MOSET-cells of the power MOSFET occurs. Above $N_{cr}$, the averaged break-down voltage $V_{BR}$ decreases. This is typically caused by weakening of several MOSFET-cells while others remain at high break-down voltage. Accordingly, a current may be filamented which may even result in permanent device failure. Therefore, the unstable region B above $N_{cr}$ is typically to be avoided.

The semiconductor device 100 illustrated in FIG. 1 allows for applying a voltage difference between the first field terminal F1 and the second field terminal F2, for example when the semiconductor device 100 is not operating as a MOSFET, for example during a standstill of a car in an automotive application. Applying voltage differences, typically a sequence of voltage pulses, between the first field terminal F1 and the second field terminal F2 results in a corresponding power dissipation of the diode formed by the first and second portion 11A, 11B of the field electrode 11 and thus intermediate heating. Using appropriate voltage differences and pulse lengths, temperatures in the dielectric region 9, in particular in the field dielectric region 9a of about 150° C. to about 350° C., more typically of about 300° C. to about 350° C. may be reached. Accordingly, hot charge carrier induced damages of the dielectric region 9 may be at least partly healed and/or the dielectric region 9 may at least partly be discharged. Thus, the MOSFET may be kept in the stable region A for a much higher number of repetitive avalanche events than $N_{cr}$ even if not all hot charge carrier induced damages are healed. This typically improves reliability, avoids external thermal curing and reduces maintenance costs.

Furthermore, less energy is typically required in comparison to external thermal curing. This is because the heat is generated in the close proximity of the regions 9 to be thermally treated.

Semiconductor device 100 is typically a power semiconductor device and may be used as a low-side or high-side power switch in bridge circuits to drive an electric motor. In this embodiment, the semiconductor device 100 typically includes a plurality of unit cells which form a lattice when seen form above.

Figure 2:
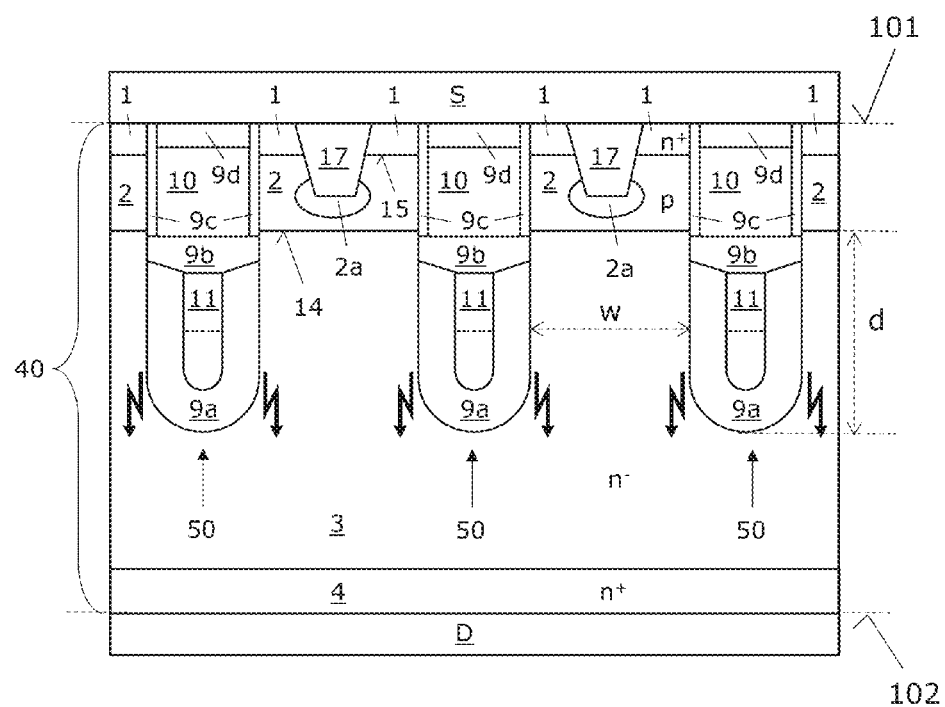
FIG. 2 illustrates a vertical cross-section a field-effect transistor according to an embodiment.

FIG. 2 shows a vertical cross-section through a semiconductor device 150. Semiconductor device 150 is similar to the semiconductor device 100 explained above with regard to FIG. 1. Semiconductor device 150 also includes source regions 1, a drain region 4, body regions 2 and a drift region 3. When the field electrodes 11 arranged in the lower portion of the exemplary three vertical trenches 50 include portions of different doping types as indicated by the dashed line, a vertical cross-section through the semiconductor device 100 may even correspond to the device structure illustrated in FIG. 2.

Two main device concepts having different avalanche properties are commonly used—the classical field electrode concept and the dense trench concept. In semiconductor devices of the classical field electrode concept, the avalanche breakdown occurs close to a contact plug 17 for contacting the body region 2 via a higher doped body contact region 2a with the source metallization and the source terminal S, respectively. Different thereto, the location of the breakdown is arranged close to the bottoms of the trenches 50 in semiconductor devices formed according to the dense trench concept with tall mesa regions between neighboring trenches. While semiconductor devices of the dense trench concept exhibit improved properties regarding on-state resistance in comparison with standard devices of the classical field electrode concept, dense trench devices are more susceptible to avalanche breakdowns.

Note that contact plugs 17 and the body contact regions 2a may only be realized in certain vertical cross-sections, for example in a vertical cross-section of the semiconductor device 150 without the vertical trenches 50. This allows even closer vertical trenches 50. Note further, that a gate metallization in ohmic contact with the gate electrodes 10 via further contact plugs 17 extending through the dielectric portion 9d covering the gate electrodes 10 is typically also provided on the main horizontal surface 101.

During an avalanche breakdown charge carriers generated in close proximity to the trench 50 flow along the trench-substrate interface either towards the body region 2 and then to the body contact region 2a or towards the drain region 4 depending on their conductivity type. During this flow, the charge carriers may be scattered into the adjacent insulating layers (field dielectric region 9a or gate dielectric region 9c) and become trapped and accumulated in the respective insulating layers. The trapped charge carriers can cause a drift of the electrical properties of the device which could lead to a changed behavior and eventually to a malfunction of the device as explained above.

The location of a breakdown is indicated by flashes in FIG. 2. The breakdown locations depend among others on the ratio between spacing w of adjacent trenches 50 and the penetration depth of the vertical trenches 50 and the vertical extension d of the vertical trenches 50 in the drift region 3, respectively. For small ratios of w/d, for example for values of w/d which are smaller than about 0.8, the breakdown locations will occur in the mesa region close to respective bottom portion of the vertical trenches 50, especially when the spacing w is smaller than about 1.5 times the trench width. For larger ratios of w/d, the breakdown locations in the mesa regions between the vertical trenches 50 are closer to the pn-junction 14 between the body regions 2 and the drift region 3.

In the exemplary embodiment, each field electrode 11 includes a first portion and a second portion 11b which are spaced apart from each other when seen from above. A first field terminal F1 is in low ohmic contact with the first portion 11a and a second field terminal F2 is in low ohmic contact with the second portion 11b. The first field terminal F1 and the second field terminal F2 may also be arranged of the main surface 101.

In so doing, each field electrode 11 forms a resistor that may be used to heat-up the dielectric region 9, for example the field dielectric region 9a, to temperatures in a range of about 150° C. to about 350° C., more typically of about 300° C. to about 350° C. Accordingly, hot charge carrier induced damage of the dielectric region 9 may be healed by applying voltage pluses between first field terminal F1 and the second field terminal F1. Thus, the MOSFET 150 may be kept in the stable region even after a large numbers of repetitive avalanche events. This typically improves reliability, avoids external thermal curing and reduces maintenance costs.

The resistance of a resistor formed by field electrode 11 is typically higher than about 1 kOhm, more typically higher than about 5 kOhm, and even more typically higher than about 10 kOhm. The resistance of a resistor formed by field electrode 11 may be even higher than about 100 kOhm. Typically, the resistance of the field electrode 11 per horizontal unit length is larger than about 1 kOhm/mm, more typically large than about 1 kOhm/mm, and even more typically large than about 10 kOhm/mm.

MOSFET 150 is typically also a power MOSFET and may, for example, be used as a low-side or high-side power switch in bridge circuits to drive an electric motor.

The semiconductor device 100, 150 as described herein allow operating such that accumulation of the hot charge carriers generated during avalanche breakdown is avoided or at least significantly reduces by applying one or more electric relaxation pulses. This makes them well suited for many power applications in which so-called repetitive avalanche breakdowns regularly happen, for example with a given frequency during driving an external load to which the power semiconductor device 100, 150 is connected. In the following, methods for operating field-effect transistor are explained in more detail.

Figure 3:
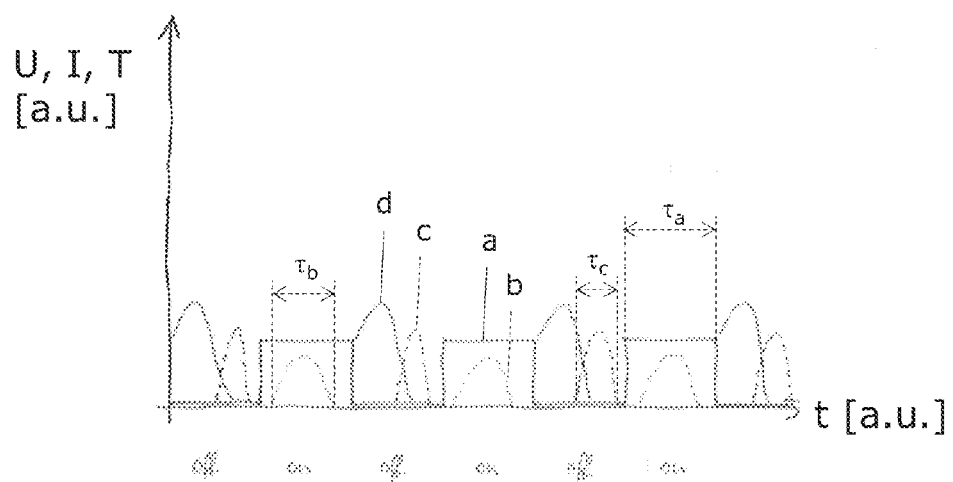
FIG. 3 illustrates a pulse regime of a method for operating a field-effect transistor.

FIG. 3 illustrates a pulse regime of a method for operating a field-effect transistor, typically a MOSET, for example a dense-trench MOSET such as the MOSFET 100, 150 explained above with regard to FIGS. 1 and 2. The MOSFET typically includes a semiconductor body, a gate electrode which is insulated from the semiconductor body and in ohmic contact with a gate terminal G, a field electrode which is arranged next to and insulated from the gate electrode and insulated from the semiconductor body, a first field terminal F1 in ohmic contact with the field electrode, a drain terminal D in ohmic contact with a drift region of the semiconductor body, and a source terminal S in ohmic contact at least with a source region of the semiconductor body. As explained above with regard to FIGS. 1 and 2, the MOSFET may further include a second field terminal F2.

In the exemplary embodiment, the MOSFET is used to drive an inductive load such as an electric motor. For example, the MOSET may be used as a high-side or a low-side switch of a motor driver circuitry. Accordingly, the drain terminal D and the source terminal S of the MOSFET are electrically connected to the inductive load.

After connecting the drain terminal D and the source terminal S to the inductive load, a sequence of voltage pulses is applied between the gate terminal and the source terminal to drive the conductive load. This is illustrated in FIG. 3 by a curve a showing the voltage difference U between the gate terminal G and the source terminal S as function of time t. The voltage pulses a may be substantially rectangular and may have peak voltages of about 5 V or 10 V. This results in repetitively switching the MOSFET. Due to the inductance of the load, the MOSFET may be repetitively driven in an avalanche mode during reversely biasing the body diode of the MOSFET in between the voltage pulses a, in particular at higher switching speeds. During the avalanche mode, avalanche multiplication occurs in the drift region close to a dielectric region insulating the field electrode and the gate electrode from the drift region of the MOSFET. This results in high current peaks between the source terminal and the drain terminal and/or high temperature as illustrate by a curve d in FIG. 3 showing a temperature T resulting from high currents I. In the following, the voltage pulses a are also referred to as electric switching pulses and first voltages pulses, respectively.

According to an embodiment, one or more electric relaxation pulses (curves b, c in FIG. 3) are applied to the MOSFET to reduce an accumulation of charges in the dielectric region due to hot charge carriers generated in the avalanche mode. Accordingly, the MOSFET may be kept in the stable region even after larger numbers of repetitive avalanche events. This typically improves reliability, avoids external thermal curing and reduces maintenance costs.

In the exemplary embodiment, the electric relaxation pulses c are applied when the field-effect transistor 100 is still in the avalanche mode, typically after the temperature (curve d) has reached a peak value, to repel the hot charge carriers from the dielectric region. For example, a positive voltage differences may be applied between the field terminal(s) F1, F2 and the drain terminal D and/or the source terminal S of an n-channel device to repel hot holes from the dielectric region, for example the field dielectric region 9a. In the following, the electric relaxation pulses c are also referred to as electric shielding pulses.

According to an embodiment, hot charge carriers which are trapped in the dielectric region 9 during the avalanche mode are at least partially discharged from the dielectric region 9 by applying electric relaxation pulses b electrically pushing the trapped charge carriers at least partly out of the dielectric region 9. For example, a positive voltage differences may be applied between the field terminal(s) F1, F2 and the drain terminal D and/or the source terminal S to repel trapped holes (positive charges) from the dielectric region 9, for example the field dielectric region 9a. Note that holes may be entrapped in the dielectric region 9 of an n-channel MOSFET during the avalanche mode. Therefore, a positive voltage differences is typically applied between the field terminal(s) F1, F2 and the source terminal during the electric relaxation pulse b for n-channel MOSFETs. In the following, the electric relaxation pulses b are also referred to as electric discharging pulses.

According to an embodiment, the electric shielding pulses c and/or the electric discharging pulses c are applied between the gate terminal G and the field terminals F1, F2 while the field electrode is not connected with the source terminal S. Accordingly, accumulation of charges in the gate dielectric region 9c may be reduced.

Furthermore, the electric shielding pulses c and the electric discharging pulses c may both be applied to further reduce the accumulation of charges in the dielectric region.

Even further, the electric relaxation pulses b which are applied when the channel is closed (off-state) may be combined with short electric relaxation pulses resulting in local heating pulses of the dielectric region as explained above with regard to FIGS. 1 and 2. In the following, the electric relaxation pulses resulting in local heating pulses are also referred to as electric heating pulses.

Typically, the dielectric region is, at least in portions which may be affected by hot charge carriers, heated to temperatures in a range from about 100° C. to about 400° C., more typically from about 150° C. to about 350° C., and even more typically from about 300° C. to about 350° C. The electric heating pulses are typically applied at least partly during the electric discharging pulses b which may be delayed with respect to the electric heating pulses. Combined application of electric heating pulses and electric discharging pulses b typically further reduces the accumulation of charges in the dielectric region.

In the exemplary embodiment illustrated in FIG. 3, the electric relaxation pulses, i.e. the electric heating pulses, the electric discharging pulses b and/or the electric shielding pulses c are applied during driving the inductive load. In this embodiment, a pulse width $\tau_a$ of the voltage pulses a is typically larger than a pulse width $\tau_b$ of the electric discharging pulses b and a pulse width $\tau_c$ of the electric shielding pulses c. In other embodiments, the pulse width $\tau_a$ of the voltage pulses a is smaller than the pulse width $\tau_b$ of the electric discharging pulses b and the pulse width $\tau_c$ of the electric shielding pulses c. Accordingly, the driving of the load is substantially not changed.

In other embodiments, the electric relaxation pulses, for example the electric discharging pulses b and/or the electric heating pulses, are applied after driving the load, i.e. in a non-operating state, for example during a standstill of the load. In these embodiments, the pulse width $\tau_b$ of the electric discharging pulses b and the pulse width of the electric heating pulses may be larger than the pulse width $\tau_a$ of voltage pulses a.

When the MOSFET is in a non-operating state, the electric heating pulses may also be applied between the source terminal S and the drain terminal D.

In other embodiments the electric heating pulses are applied between the first field terminal F1 and the second field terminal F2. This may be done both in the operating state and the non-operating state of the MOSFET. In the following circuit configuration for realizing electric relaxation pulses are explained.

Figure 4:
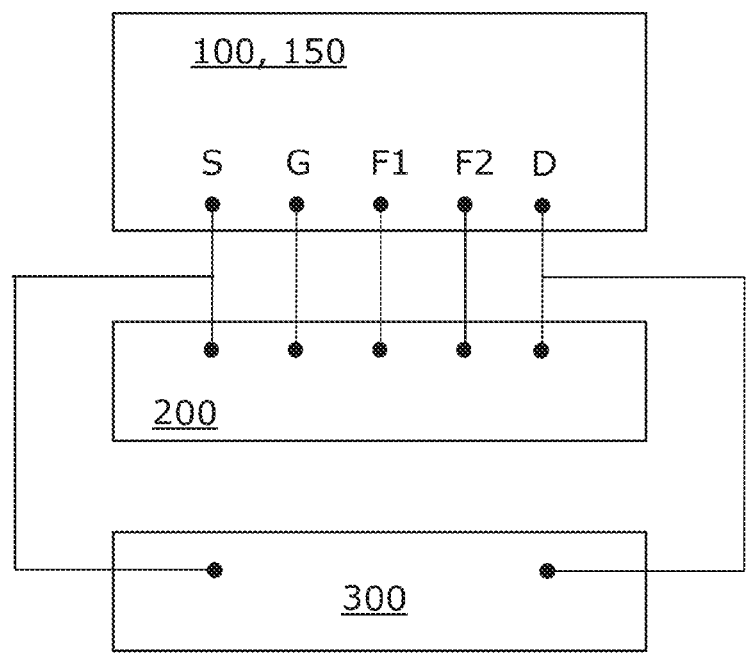
FIG. 4 illustrates a circuit configuration according to an embodiment.

FIG. 4 illustrates a circuit configuration 500. The circuit configuration 500 includes a field-effect transistor 100, 150. The field-effect transistor 100, 150 includes a semiconductor body 40 having a source region 1 of a first conductivity type, a body region 2 of a second conductivity type adjoining the source region 1, and a drift region 3 of the first conductivity type adjoining the body region 2.

In the exemplary embodiment, the field-effect transistor 100, 150 includes a gate electrode 10 which is insulated from the semiconductor body 40, a field electrode 11 which is insulated from the gate electrode 10 and the semiconductor body 40, a field dielectric region 9a arranged between the field electrode 11 and the semiconductor body 40, a gate terminal G in ohmic contact with the gate electrode 10, a first field terminal F1 and a second field terminal F2 which are both in ohmic contact with the field electrode 11, a source terminal S in ohmic contact at least with the source region 1, and a drain terminal D in ohmic contact with the drift region 3, typically via a drain contact region. Typically, the field-effect transistor 100, 150 is a MOSFET similar as explained above with regard to FIGS. 1, 2, more typically a power MOSFET.

In other embodiments, the field-effect transistor 100, 150 has only one field terminal F1.

Furthermore, the drain terminal D and the source terminal S are electrically connected to a load 300, typically an inductive load such as an electric motor. For example, the field-effect transistor 100, 150 may be a low-side or a high-side power switch in a bridge circuit. For sake of clarity, further details of the bridge circuit are not illustrated in FIG. 4.

In the exemplary embodiment, a driver configuration 200 is connected to the gate terminal G, the field terminals F1, F2, the source terminal S and the drain terminal D. The driver configuration 200 is configured to generate a first sequence of first voltage pulses between the gate terminal G and the source terminal S, typically electric switching pulses as explained above with regard to FIG. 3, and a second sequence of second voltage pulses between the field terminal(s) F1, F2 and the source terminal S having a shorter pulse width than the first voltage pulses. In between the electric switching pulses, the field-effect transistor 100, 150 may be driven into an avalanche mode. The second voltage pulses may be electric discharging pulses b and/or an electric shielding pulses c as explained above with regard to FIG. 3.

According to an embodiment, the driver configuration 200 is further configured to apply one or more third voltage pulses between the first field terminal F1 and the second field terminal F2 of the field-effect transistor 100, 150 to locally heat the field dielectric region 9a or a gate dielectric region 9c arranged between the gate electrode 10 and at least a channel region of the body region 2. For example, the driver configuration 200 may be configured to apply a third sequence of electric heating pulses as explained above with regard to FIGS. 1 to 3.

Due to applying the second voltage pulses and/or the electric heating pulses, the accumulation of charges in the dielectric region 9 due to hot charge carriers generated in the avalanche mode is at least reduced.

The driver configuration 200 may be configured to generate the second voltage pulses during driving the load 300, for example while the drain terminal D and the source terminal S are on a different voltage and/or when the gate terminal G and the source terminal S are substantially on the same voltage. For example, an electric shielding pulse may be applied between the field electrode(s) F1, F2 and the source electrode S during an avalanche mode while the gate terminal G and the source terminal S are substantially on the same voltage so that the channel region is non-conducting (off-state).

In this embodiment, the driver configuration 200 is typically configured to generate the second voltage pulses (electric shielding pulses) with a given phase-shift to the first voltage pulses. The driver configuration 200 may, however, also be configured to detect an avalanche mode, for example by monitoring the current between the drain terminal D and the source terminal S, and to generate the second voltage pulses (electric shielding pulses) with a given time delay to the onset of the avalanche multiplication or to a time where a maximum avalanche current is detected.

According to an embodiment, the driver configuration 200 is configured to generate electric discharging pulses between the field electrode(s) F1, F2 and the source electrode S as second voltage pulses while the gate terminal G and the source terminal S are on different voltages so that the channel region is conducting (on-state).

According to an embodiment, the driver configuration 200 is configured to generate a fourth sequence of fourth voltage pulses between the drain terminal D and the source terminal S to heat the field dielectric region 9a and/or the gate dielectric region 9c in a non-operating state of the field-effect semiconductor transistor 100, 150 in which the load 300 is not driven.

Furthermore, the driver configuration 200 is typically also configured to generate the second voltage pulses (electric shielding pulses) in the non-operating state.

Even further, the driver configuration 200 is typically configured to generate, in the non-operating state, the sequence of second voltage pulses (electric shielding pulses) in a coordinated manner with the third sequence of third voltage pulses and/or the fourth sequence of fourth voltage pulses to combine thermal treatment and electric field mediated treatment of the dielectric regions which were exposed to hot charge carries generated during the avalanche mode.

To save electric energy, the driver configuration 200 may be configured to adapt the scheme of generating second, third and/or fourth voltages pulses in accordance with the number and/or characteristics of the avalanche events.

The driver configuration 200 may be is formed as a separate integrated circuit, i.e. as a device which is not integrated in the semiconductor body 40 of the field-effect transistor. Both the driver configuration 200 and the field-effect transistor 100, 150 can be arranged on a common substrate or board. There are many options for arranging, for instance as chip-on-chip or chip-by-chip arrangement. In the alternative case of an integrated solution, the driver configuration 200 can be formed as a circuit or device which is integrated in the semiconductor body 40 of the 100, 150, for instance at its periphery.

According to an embodiment, the circuit configuration 500 includes a field-effect transistor 100, 150 and a driver configuration 200. The field-effect transistor 100, 150 includes a semiconductor body 40 including a source region 1 of a first conductivity type, a body region 2 of a second conductivity type adjoining the source region 1, and a drift region 3 of the first conductivity type adjoining the body region 2. The field-effect transistor 100, 150 further includes a gate electrode 10, a field electrode 11, a dielectric region arranged between the gate electrode 10 and the field electrode 11, between the gate electrode 10 and the semiconductor body 40 and between the field electrode 11 and the semiconductor body 40. A gate terminal G is in ohmic contact with the gate electrode 10. A first field terminal F1 is in ohmic contact with a first portion 11a of the field electrode 11. A drain terminal D is in ohmic contact with the drift region 3. A source terminal S is in ohmic contact at least with the source region 1. The driver configuration 200 is connected to the gate terminal G, the first field terminal F1, the drain terminal D and the source terminal S. The driver configuration 200 is operable in a protecting mode in which it is configured to apply a first sequence of first voltage pulses between the gate terminal G and the source terminal S to switch the field-effect transistor 100, 150, and a second sequence of second voltage pulses between the first field terminal F1 and the source terminal S to at least reduce the accumulation of charge carriers in the dielectric region by applying electric fields. The driver configuration 200 is further configured to apply a third sequence of third voltage pulses between the first field terminal F1 and a second field terminal F2 in ohmic contact with a second portion 11b of the field electrode 11, and/or a fourth sequence of fourth voltage pulses between the drain terminal D and the source terminal S to at least reduce the accumulation of charge carriers in the dielectric region by thermal treatment of the dielectric region. The driver configuration 200 is typically configured to apply the second sequence of second voltage pulses and the third sequence of third voltage pulses in the protecting mode and/or a rest mode in which the load 300 is not driven. Furthermore, the driver configuration 200 is typically configured to apply the fourth sequence of fourth voltage pulses in the rest mode.

Typically, the circuit configuration 200 is configured to operate the field-effect transistor 100, 150 in a normal operating mode for driving the load 300. During normal operating mode, the first field terminal F1, and typically also the second field terminal F2, is in low ohmic contact with the source terminal S and a first sequence of first voltage pulses is applied between the gate electrode G and the source electrode S. The circuit configuration 200 is configured to detect an avalanche multiplication in the field-effect transistor 100, 150, and to initiate the protecting mode when the avalanche multiplication is detected.

Although various exemplary embodiments of the invention have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted. It should be mentioned that features explained with reference to a specific figure may be combined with features of other figures, even in those cases in which this has not explicitly been mentioned. Such modifications to the inventive concept are intended to be covered by the appended claims.

Spatially relative terms such as "under", "below", "lower", "over", "upper" and the like are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A method for operating field-effect transistor comprising a source terminal, a drain terminal, a gate terminal, a drift region and a dielectric region adjoining the drift region, the method comprising:
- connecting at least one of the drain terminal and the source terminal to a load;
- applying a sequence of voltage pulses between the gate terminal and the source terminal to repetitively switch the field-effect transistor such that the field-effect transistor is driven in an avalanche mode between the voltage pulses, during the avalanche mode avalanche multiplication occurring in the drift region close to the dielectric region; and
- applying at least one electric relaxation pulse to the field-effect transistor to reduce an accumulation of charges in the dielectric region due to hot charge carriers generated in the avalanche mode.

2. The method of claim 1, wherein applying the at least one electric relaxation pulse results in a local heating pulse of the dielectric region.

3. The method of claim 2, wherein a temperature of the local heating pulse is in a range of about 150° C. to about 350° C.

4. The method of claim 1, wherein the hot charge carriers are trapped in the dielectric region during the avalanche mode, and wherein applying the at least one electric relaxation pulse results in at least partially discharging the dielectric region.

5. The method of claim 1, wherein the at least one electric relaxation pulse is applied when the field-effect transistor is in the avalanche mode to repel the hot charge carriers from the dielectric region.

6. The method of claim 1, wherein the at least one electric relaxation pulse is applied when the field-effect transistor is in an on-state during applying the sequence of voltage pulses.

7. The method of claim 1, wherein the at least one electric relaxation pulse is applied when the field-effect transistor is in an off-state during applying the sequence of voltage pulses.

8. The method of claim 1, wherein the at least one electric relaxation pulse is applied when the field-effect transistor is in a non-operating state.

9. The method of claim 1, wherein the at least one electric relaxation pulse is applied between the source terminal and the drain terminal.

10. The method of claim 1, wherein the field-effect transistor comprises:
- a semiconductor body comprising a source region and a body region which forms a first pn-junction with the source region and a second pn-junction with the drift region;
- a gate electrode which is insulated from the semiconductor body and in ohmic contact with the gate terminal;
- a field electrode which is arranged next to and insulated from the gate electrode; and
- a field terminal in ohmic contact with the field electrode, wherein the dielectric region is arranged between the field electrode and the drift region; and
- wherein the at least one electric relaxation pulse is applied between the field terminal and the source terminal.

11. The method of claim 1, wherein the field-effect transistor comprises a semiconductor body, a gate electrode which is insulated from the semiconductor body and in ohmic contact with the gate terminal, a field electrode which is arranged next to and insulated from the gate electrode, and a first field terminal in ohmic contact with the field electrode, wherein the at least one electric relaxation pulse is applied between the gate terminal and the first field terminal while the field electrode is not connected with the source terminal.

12. The method of claim 11, wherein the field-effect transistor is an n-channel MOSFET, and wherein a voltage difference between the first field terminal and the source terminal is larger than zero during the at least one electric relaxation pulse.

13. The method of claim 1, wherein the field-effect transistor comprises a semiconductor body, a gate electrode which is insulated from the semiconductor body and in ohmic contact with the gate terminal, a field electrode which is arranged next to and insulated from the gate electrode, a first field terminal in ohmic contact with the field electrode, and a second field terminal in ohmic contact with the field electrode, wherein the at least one electric relaxation pulse is applied between the second field terminal and the first field terminal.

14. The method of claim 1, wherein a pulse width of the voltage pulses is larger than a pulse width of the at least one electric relaxation pulse.

15. A circuit configuration, comprising:
- a field-effect transistor, comprising:
  - a semiconductor body comprising a source region of a first conductivity type, a body region of a second conductivity type adjoining the source region, and a drift region of the first conductivity type adjoining the body region;
  - a gate electrode which is insulated from the semiconductor body;
  - a field electrode which is insulated from the gate electrode;
  - a dielectric region arranged between the field electrode and the semiconductor body;
  - a gate terminal in ohmic contact with the gate electrode;
  - a field terminal in ohmic contact with the field electrode; and
  - a source terminal in ohmic contact at least with the source region; and
- a driver configuration connected to the gate terminal, the field terminal, and the source terminal, the driver configuration being configured to generate a first sequence of first voltage pulses between the gate terminal and the source terminal, and a second sequence of second voltage pulses between the field terminal and the source terminal, the second voltage pulses comprising a shorter pulse width than the first voltage pulses.

16. The circuit configuration of claim 15, wherein the field-effect transistor further comprises a drain terminal connected to the driver configuration and in ohmic contact with the drift region, and wherein the driver configuration is configured to generate the second voltage pulses while the drain terminal and the source terminal are on a different voltage.

17. The circuit configuration of claim 15, wherein the driver configuration is configured to generate the second voltage pulses when the gate terminal and the source terminal are substantially on the same voltage.

18. The circuit configuration of claim 15, wherein the driver configuration is configured to generate the second voltage pulses with a given phase-shift to the first voltage pulses.

19. The circuit configuration of claim 15, wherein the gate electrode is arranged in a trench extending into the semiconductor body, and wherein the field electrode is arranged in the trench and below the gate electrode.

20. The circuit configuration of claim 15, wherein the driver configuration is further configured to apply a third voltage pulse to the field-effect transistor to locally heat the dielectric region.

21. A field-effect transistor, comprising:
- a semiconductor body comprising a source region of a first conductivity type, a body region of a second conductivity type adjoining the source region, and a drift region of the first conductivity type adjoining the body region;
- a field electrode comprising a first portion and second portion;
- a gate electrode which is insulated from the field electrode;
- a dielectric region arranged at least between the field electrode and the drift region;
- a first field terminal in ohmic contact with the first portion; and
- a second field terminal in ohmic contact with the second portion.

22. The field-effect transistor of claim 21, wherein the first portion and the second portion are of opposite conductivity type and form a pn-junction.

23. The field-effect transistor of claim 21, wherein a resistance of a resistor formed by the field electrode is higher than about 1 kOhm.

24. The field-effect transistor of claim 21, wherein at least one of the gate electrode and the field electrode are arranged in a vertical trench extending into the semiconductor body.

25. A circuit configuration, comprising:
a field-effect transistor, comprising:
- a semiconductor body comprising a source region of a first conductivity type, a body region of a second conductivity type adjoining the source region, and a drift region of the first conductivity type adjoining the body region;
- a gate electrode;
- a field electrode;
- a dielectric region arranged between the gate electrode and the field electrode, between the gate electrode and the semiconductor body and between the field electrode and the semiconductor body;
- a gate terminal in ohmic contact with the gate electrode;
- a first field terminal in ohmic contact with a first portion of the field electrode;
- a drain terminal in ohmic contact with the drift region; and
- a source terminal in ohmic contact at least with the source region; and
a driver configuration connected to the gate terminal, the first field terminal, the drain terminal and the source terminal, the driver configuration being in a protecting mode configured to:
- apply a first sequence of first voltage pulses between the gate terminal and the source terminal to switch the field-effect transistor; and
- a second sequence of second voltage pulses between the first field terminal and the source terminal;
wherein the driver configuration is further configured to apply at least one of:
- a third sequence of third voltage pulses between the first field terminal and a second field terminal in ohmic contact with a second portion of the field electrode; and
- a fourth sequence of fourth voltage pulses between the drain terminal and the source terminal.

26. The circuit configuration of claim 25, wherein the circuit configuration is configured to operate the field-effect transistor in a normal mode of operation in which the first field terminal is connected to the source terminal, to detect an avalanche multiplication in the field-effect transistor, and to initiate the protecting mode when the avalanche multiplication is detected.

* * * * *